(12) United States Patent
Ellis

(10) Patent No.: US 7,303,844 B2
(45) Date of Patent: Dec. 4, 2007

(54) MARKING SYSTEM FOR A SEMICONDUCTOR WAFER TO IDENTIFY PROBLEMS IN MASK LAYERS

(75) Inventor: John Ellis, Austin, TX (US)

(73) Assignee: Silicon Labs CP, Inc., Austin, TX (US)

( * ) Notice: Subject to any disclaimer, the term of this patent is extended or adjusted under 35 U.S.C. 154(b) by 466 days.

(21) Appl. No.: 10/816,573

(22) Filed: Mar. 31, 2004

(65) Prior Publication Data

US 2005/0221201 A1     Oct. 6, 2005

(51) Int. Cl.
  *G03F 1/00* (2006.01)
(52) U.S. Cl. ........................................... 430/22
(58) Field of Classification Search ............ 430/5, 430/22; 716/19–21
   See application file for complete search history.

(56) References Cited

U.S. PATENT DOCUMENTS 6,924,090 B2 *   8/2005   Hirooka ..................... 430/394
7,160,654 B2 *   1/2007   Tsai ............................ 430/22

* cited by examiner

Primary Examiner—S. Rosasco
(74) Attorney, Agent, or Firm—Howison & Arnott, L.L.P.

(57) ABSTRACT

Marking system for a semiconductor wafer to identify problems in mask layers. A method for forming a mask which includes the step of first creating at least one drawing layer that defines changes to the structures to be formed on the surface of a semiconductor substrate at one step in the processing thereof, which step involves the use of a mask. The at least one drawing layer will define a pattern region that will either result in removal of the material from the semiconductor substrate in the defined pattern region, or removal of matter from the semiconductor substrate around the defined pattern region. An indicator area is created in the at least one drawing layer, the indicator area having an indicator region disposed therein that will result in removal of material from around the indicator region regardless of whether the mask is a dark tone mask or a clear tone mask, the indicator region appearing in the negative if the mask is a dark tone mask. A mask is then created from the at least one drawing layer as either a dark tone mask having a transparent region corresponding to the defined pattern region for exposing the underlying substrate if the defined pattern region is associated with a process that results in material being removed from around the defined pattern region, or as a clear tone mask having an occluding region corresponding to the defined pattern region if the defined pattern region is associated with a process that results in material being removed from the defined pattern region.

3 Claims, 4 Drawing Sheets

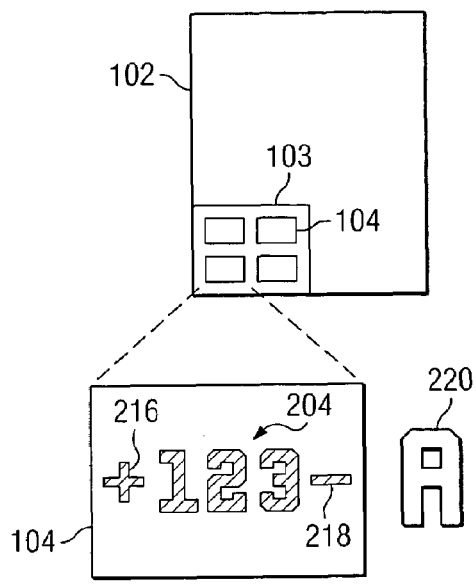
*FIG. 1*
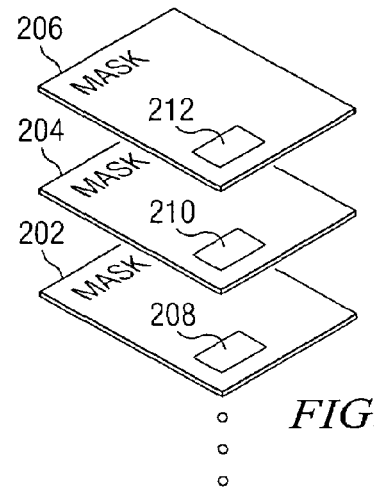
*FIG. 2*
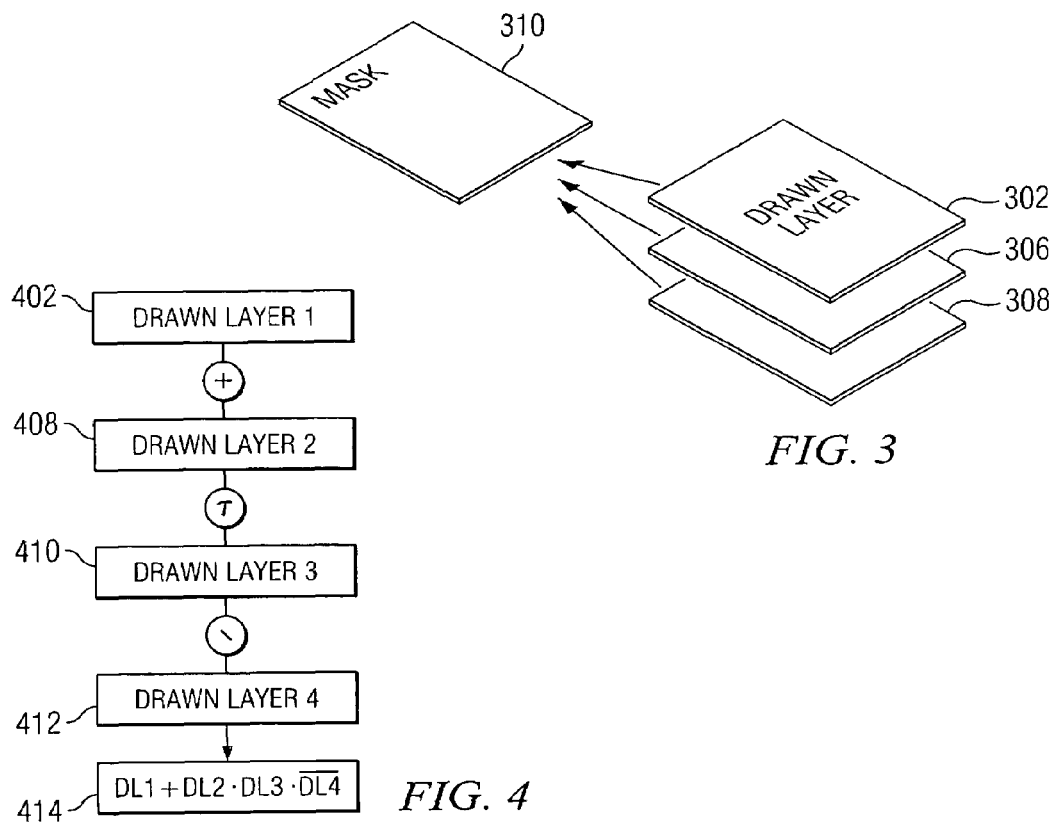
*FIG. 3*
*FIG. 4*

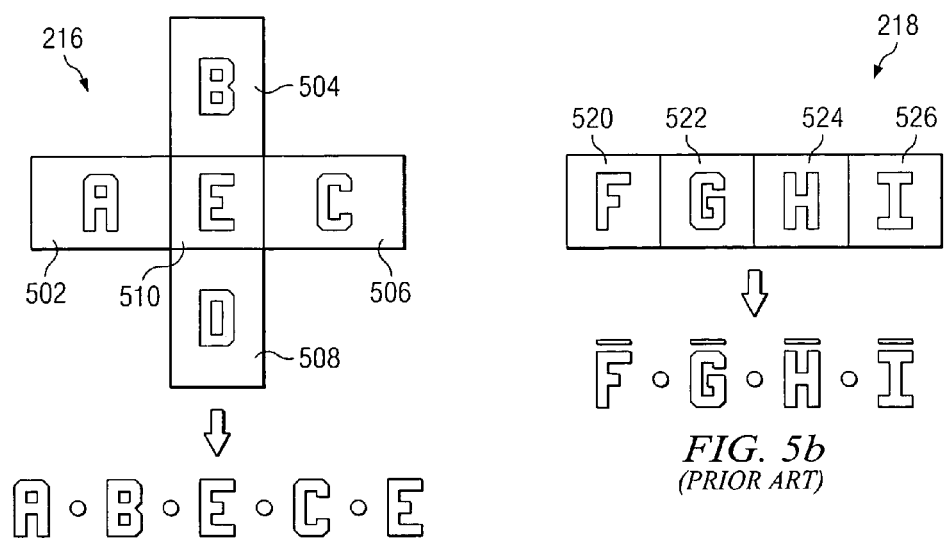
FIG. 5a
(PRIOR ART)
FIG. 5b
(PRIOR ART)
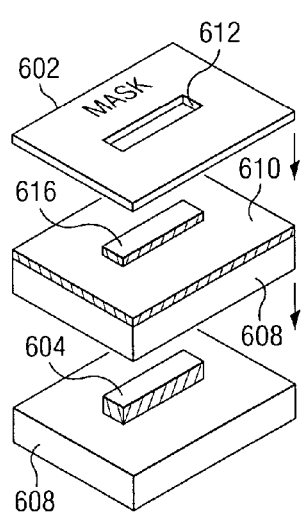
FIG. 6
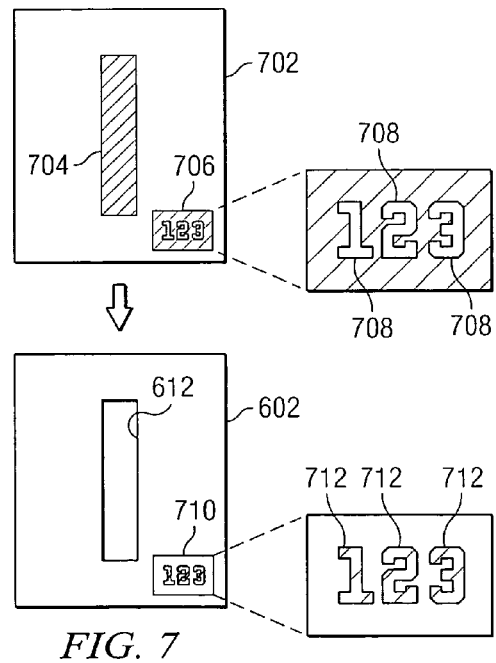
FIG. 7

MARKING SYSTEM FOR A SEMICONDUCTOR WAFER TO IDENTIFY PROBLEMS IN MASK LAYERS

TECHNICAL FIELD OF THE INVENTION

The present invention pertains in general to methods for generating masks and, more particularly, to a marking system for identifying problems in the manufacture of masks.

CROSS-REFERENCE TO RELATED APPLICATIONS

N/A.

BACKGROUND OF THE INVENTION

In order to process a semiconductor device, a plurality of process steps must be performed. At each of these process steps, there is typically a "masking" step wherein certain portions of the substrate are masked off from the process, i.e., the process being performed is inhibited from acting upon that certain area. For example, during an implant step, there are only certain areas of substrate that are to be subjected to the implant of impurities therein. It is important to prevent other areas from being implanted with these impurities. This masking step utilizes a photo resist etching procedure wherein the photo resist is first deposited on the surface of the substrate and then exposed through the mask and then etched such that the unexposed portions of the photo resist are removed to expose certain areas of the substrate for processing.

When the masks are defined, they are defined with a set of data that consists of the various processes that are involved at particular stages in the process. For example, it may be that a particular integrated circuit has a flash memory associated therewith which is subject to a "flash implant process." During this flash process, there may be a p-implant that is performed. The data will indicate that the area to be processed will result in a p-type area being implanted during a flash process, which p-implant for the flash process may be different than a p-implant for a standard device. If the p-type implant were to be performed during a non-flash implant process, it would be important that the data indicate that a p-type implant be performed and that it is to be performed during the flash process. The database is created such that the physical layout of the mask is provided and also information as to when that layout should be processed, wherein there are a plurality of separate physical layouts associated with a given mask, each created as a separate operation. This data is typically provided in a GDSII format that is provided to the manufacturer in the form of the layers that must be combined to form a mask, and the manufacturer converts this from that format to their own format and then manufactures the mask in accordance with that format. However, if the manufacturer made a mistake and did not convert the data correctly, it might be that the p-type implant were made into a particular area during a non-flash process when it should have been made during a flash process, this possibly resulting in a different implant level. This is due to the fact that the manufacturer must ensure that all of the correct physical layout layers are combined correctly in the mask.

There are also two types of conversion operations that need the attention of the manufacturer, that of a clear tone mask and a dark tone mask. For some reasons, a structure is defined wherein the actual data indicates an area that is to remain on the substrate after processing whereas another process provides a structure that results in material being removed in accordance with the structure. During manufacturing, the data is first converted, the mask is inverted and then a mask layout generated from the data. For example, a metal strip will have data generated indicating a strip of metal as the pattern. The data for this structure must be converted to a mask wherein the material for that structure will remain, i.e., the photo resist around that area is removed and that area outside of the structure etched. This will require the mask to have that area (of the metal strip) as the clear area of the mask so that the photo resist will be exposed over the area that will correspond to the structure. When the mask is made though, the area associated with the structure is dark—not transparent. This is a dark tone mask which, by the process that it is used, results in a negative image. If the manufacturer fails to do this, the results will not be acceptable. For a clear tone mask, there is no inversion required, as the structure that is the subject of the mask is laid out in the physical layout as it would appear in the mask. For example, if a via is to be formed, the physical layout will have a solid area indicating the via, but the mask must have a "hole" in that area and, therefore, must not be inverted to indicate such.

SUMMARY OF THE INVENTION

The present invention disclosed and claimed herein, in one aspect thereof comprises a method for checking the formation of a mask which includes the step of first creating at least one drawing layer that defines changes to the structures to be formed on the surface of a semiconductor substrate at one step in the processing thereof, which step involves the use of a mask. The at least one drawing layer will define a pattern region that will either result in removal of the material from the semiconductor substrate in the defined pattern region, or removal of matter from the semiconductor substrate around the defined pattern region. An indicator area is created in the at least one drawing layer, the indicator area having an indicator region disposed therein that will result in removal of material from around the indicator region regardless of whether the mask is a dark tone mask or a clear tone mask, the indicator region appearing in the negative if the mask is a dark tone mask. A mask is then created from the at least one drawing layer as either a dark tone mask having a transparent region corresponding to the defined pattern region for exposing the underlying substrate if the defined pattern region is associated with a process that results in material being removed from around the defined pattern region, or as a clear tone mask having an occluding region corresponding to the defined pattern region if the defined pattern region is associated with a process that results in material being removed from the defined pattern region.

BRIEF DESCRIPTION OF THE DRAWINGS

For a more complete understanding of the present invention and the advantages thereof, reference is now made to the following description taken in conjunction with the accompanying Drawings in which:

FIG. 1 illustrates a diagrammatic view of a substrate having the marking system of the present disclosure;

FIG. 2 illustrates a diagrammatic view of the various mask layers that are provided in an example of a mask set;

FIG. 3 illustrates a diagrammatic view of the various processes that might make up a given mask layer in the mask set;

FIG. 4 illustrates the process for forming a given mask layer;

FIGS. 5a and 5b illustrate prior art marking for providing Boolean indicators;

FIG. 6 illustrates a dark area masking process for removing the portion of the layer about a defined structural mask;

FIG. 7 illustrates the method for forming a mask with inversion required;

DETAILED DESCRIPTION OF THE INVENTION

Figure 8:
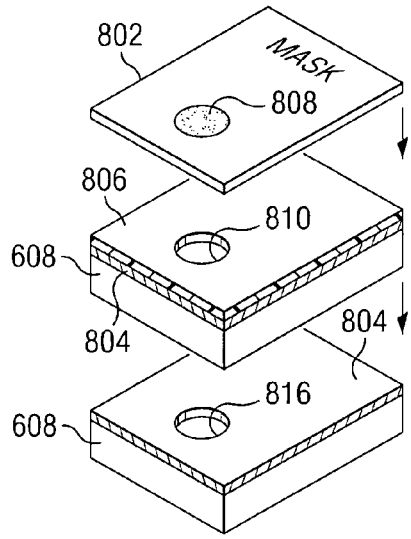
FIG. 8 illustrates a process for defining an area of the substrate where material is to be removed.

Referring now to FIG. 1, there is illustrated a diagrammatic view of an integrated circuit 102 that has circuitry formed on the surface thereof. This circuitry is formed through the use of a plurality of masks, each mask defining a processing step in the manufacturing process. The resulting integrated circuit will have disposed at the low corner thereof, in the disclosed embodiment, indications of various mask layers, in a region 103, there being a plurality of indicator regions 104 contained therein, each associated with a different mask level. This will be described herein below. These indicators at the mask level allow an observer to quickly ascertain from the indicators themselves information about the mask generation process and whether the manufacturer had in fact assembled the correct layout layers for each mask, from design data provided by the designer.

Referring now to FIG. 2, there is illustrated a diagrammatic view of the various mask layers that are provided. There are illustrated only three mask layers 202, 204 and 206. Each of the mask layers 202-206 has associated therewith a region 208, 210 and 212, respectively, for containing the mask identification information, these being non-overlapping. This mask identification information typically constitutes, in the disclosed embodiment, a number 214, a symbol 216 in the shape of a "+" and a symbol 218 in the form of a "–" which will be described in more detail herein below and a mask revision letter 220. When all of the process steps are performed utilizing the masks 202-206 (and the other masks not shown), the region 104 will have a defined area that is visible in each of the regions 208, 210 and 212. Therefore, one can look at the integrated circuit 102 and determine which masks were utilized to fabricate the integrated circuit and whether the mask was generated correctly.

Referring now to FIG. 3, there is illustrated a diagrammatic view of the method for creating the masks. The standard method is to utilize a standard layout format which is referred to as a GDS II. This layout format provides for a plurality of drawn layers 302, 306 and 308, in the disclosed embodiment, to be merged into a mask 310. The use of multiple drawn layers for a given mask facilitates the ease of layout and the verification of manufacturing design rules. For example, if a mask were utilized for patterning the second layer of polycrystalline silicon, referred to as the "Poly 2" layer, it might be that there are a number of sets of rules for the structures formed in that mask layer. For example, there could be a five volt transistor that would have one set of rules for defining the structures therein, and a three volt transistor that would have a different set of rules for defining the structure therein. The fabrication plan determines these rules and the layout designer must comply with them. It is easier to create the drawn layer for the five volt transistor separate as compared to that for the three volt transistors and, thus, provide two separate drawn layers for verification. However, they both must be fabricated in the same process step (or portions thereof) and, therefore, all of the structures must be combined in a single mask utilized for that process step. Therefore, the GDS II layout format is operable to merge the plurality of drawn layers into a single mask. However, the actual creator of the mask receives nothing but the GDS II database comprised of the multiple drawn layers and must then determine which drawn layers are put together in order to generate a particular mask. If a required drawn layer is omitted in this process, this results in a defective resultant part.

Referring now to FIG. 4, there is illustrated a flow chart for creating the mask. This is illustrated wherein a first drawn layer at a block 402 is combined with a second drawn layer through a Boolean operator at a block 408, which is then combined with a third drawn layer through a Boolean operator at a block 410 and then is combined with a fourth drawn layer through a Boolean operator at a block 412. All of these combinations result in a Boolean operation wherein all four of the drawn layers are combined. It is important that the creator of the mask knows which Boolean operators to utilize, i.e., which drawn layers comprise the mask and how they are combined. This results in a Boolean combination of, for example, where DL1 is ORed with DL2, then ANDed with DL3, and then ANDed with NOT DL4, as indicated in a block 414.

Referring now to FIGS. 5a and 5b, there is illustrated a prior art method for forming the symbols 216 and 218 in the region 104. The symbol 216 is a Boolean indicator that indicates the areas of drawn layers that are to be included in a mask. In the illustration of FIG. 5a, there are illustrated five regions 502, 504, 506, 508 and 510 in the symbol 216 that correlate with certain regions in the drawn layer. In this embodiment, the symbol 216 provides for an indication of a maximum of five drawn layers. However, any one of the regions 502-510 can be divided up into multiple regions to provide more degrees of freedom. The drawn layers are defined as "A," "B," "C," "D," and "E." For region 502, the Boolean operation is A AND B, and the region 502 is "filled in" to represent this as a "dark area" in the mask if correctly manufactured. Similarly, the drawn layer "E" will be associated with the region 504 as E and NOT other drawn layers, and so forth. Therefore, when all five drawn layers are correctly incorporated into the mask, they will result in the rendering of dark areas in all five regions 502-510; that is, during processing, these regions will be patterned and created on the mask.

With reference to FIG. 5b, the symbol 218 represents drawn layers that are not to be incorporated into a particular mask. This is facilitated by indicating any number of processes that are not in this set associated with the drawn layers for the given mask, for example, drawn layers F, G, H and I, which are not supposed to be incorporated in this mask. Typically, there might be a diffusion drawn layer that is to be combined with the drawn layer for a flash memory process. Thus, one of a plurality of regions 520, 522, 524 and 526 might be associated with a Boolean operation on drawn layers A and B of "A AND B," where the drawn layer A may be a diffusion layer and the drawn layer B may be the "NOT FLASH PROCESS" layer, wherein this will be true if the diffusion is utilized without the flash process drawing layer. Since this is the inverse in the symbol 218, the region associated with this Boolean operation will be clear unless it is true. These Boolean operations are selected for common mistakes that can be made.

Referring now to FIG. 6, there is illustrated a diagrammatic view of the utilization of a mask 602 for forming a structure 604 on a substrate 608. The structure 604 could be a strip of metal or a strip of poly. For a metal strip, there will be a layer of metal 610 disposed on the substrate 608. The mask 602 is a mask that will have a "slit" pattern therein to provide a transparent opening 612 therein which corresponds to areas where the structure 604 will be formed. This opening 612 allows a photo resist layer (not shown) to be exposed and, following the exposure, a development process, leaving a layer of photo resist 616 on the surface of the metal layer 610. A subsequent etching step will etch away the poly layer 610 to leave the resulting structure 604. Therefore, the mask 602 will have an opening where the drawn structure was.

Referring now to FIG. 7, there is illustrated a diagrammatic view of forming the mask 602. Initially, a drawing layer 702 is formed which has a drawn structure 704 disposed on the surface thereof. This drawing structure leaves a dark region where the structure is provided. There is also provided an indicator region 706 at the corner thereof (noting that the indicator area 706 could be disposed anywhere on the substrate or mask). This indicator area or region 706 is illustrated as having "clear" numbers 708 associated therewith. It is noted, and as will be described herein below, that there will also be provided the symbols 216 and 218 in this region 706, although not shown for simplicity purposes. The remaining part of the indicator area 706 is dark. When the mask is rendered, the mask 602 will have the surface thereof inverted, such that dark areas in the drawing layer 702 will appear as light areas in the mask 602, i.e., it is inverted from the drawing to the mask. Similarly, this inversion operation will result in the numbers 708 that were clear in the indicator region 706 now existing in an indicator region 710 in the mask 602 with numbers 712 that are now dark, indicating that the inversion step was carried out correctly. This is referred to as a "dark tone" mask. If, for some reason, the mask were not inverted from the drawing layer, then the mask would have the opening 612 indicated as a dark area and, of course, this would result in etching away of the metal layer 610 in the region of the opening 612, as opposed to the region outside of the opening 612, i.e., there would be no opening 612. However, this would easily be noticed by viewing the numbers in the region 710, as they would appear as the numbers 708 in the region 706, i.e., the numbers would be clear and the background of the region 706 would be dark.

Referring now to FIG. 8, there is illustrated a diagrammatic view of the process for utilizing a "clear tone" mask. These are typically used for such things as Vias. A mask 802 is illustrated for forming a pattern and resulting structure on the substrate 608. In this illustration, there is provided a layer 804 of, for example, polycrystalline silicon—"poly" layer 804. This layer has disposed thereon a layer of photo resist 806 and the mask 802 has an occlusion 808 which prevents the exposure of the photo resist layer 806 within that region 808. Therefore, when the photo resist layer 806 is exposed and then developed, this will result in the removal of the photo resist from an opening 810 with a subsequent etching step providing an etched Via 816 in the layer 804.

Figure 9:
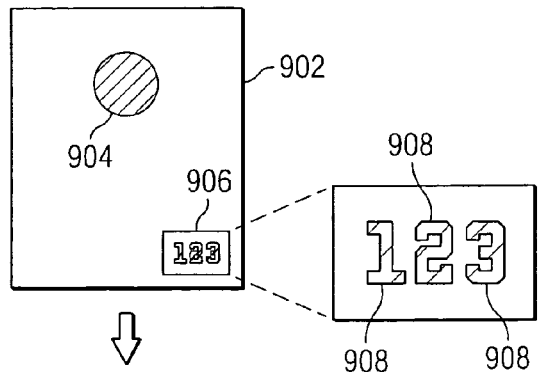
FIG. 9 illustrates diagrammatically the mask formation process for the structure of FIG. 8.
Figure 9:
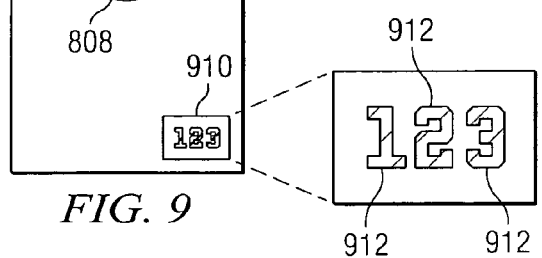

Referring now to FIG. 9, there is illustrated a diagrammatic view of the clear tone mask process. A drawing layer 902 is illustrated wherein the Via structure is formed with a drawn structure 904, this being a dark region. There is also provided an indicator region 906 therein, wherein there are provided numbers 908 that are dark. When the mask is rendered, it is rendered substantially as the drawn region, such that the drawn structure at 904 results in the occlusion 808. Additionally, the mask 802 has associated therewith an indicator region 910 which has numbers 912 formed thereon that are also dark. Therefore, the numbers in the indicator region 910 substantially track numbers in indicator region 906, i.e., they are dark in both regions. Thus, by looking at the indicator or ID in the indicator regions 910, it can be seen that the mask was made correctly. Therefore, by viewing the ID in the actual mask it is possible to see that the manufacturer has not inverted the mask. This prevents the inadvertent inversion operation or the inversion of a mask that was not to be inverted. This can be seen at the mask level or it can even be seen at the chip level.

Figure 10:
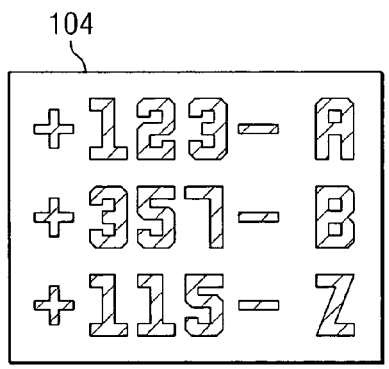
FIG. 10 illustrates the mark on a finished substrate illustrating three mask layers.

Referring now to FIG. 10, there is illustrated a diagrammatic view of the indicator region 104 which is expanded to illustrate that there are three masks reflected in this integrated circuit. It can be seen that each of the masks bears an ID in the form of a number, a "+" sign and a "−" sign. By viewing this indicator region 104, it can be seen that the masks are correctly inverted or non-inverted, as they are required to be, and that they are processed with the correct drawn layers during the manufacturing thereof and the correct version of the mask data was used. Therefore, by allowing each of the masks to have their IDs and Boolean symbols viewable, a quick quality assessment can be made of the manufacturing process for all masks.

Figure 11:
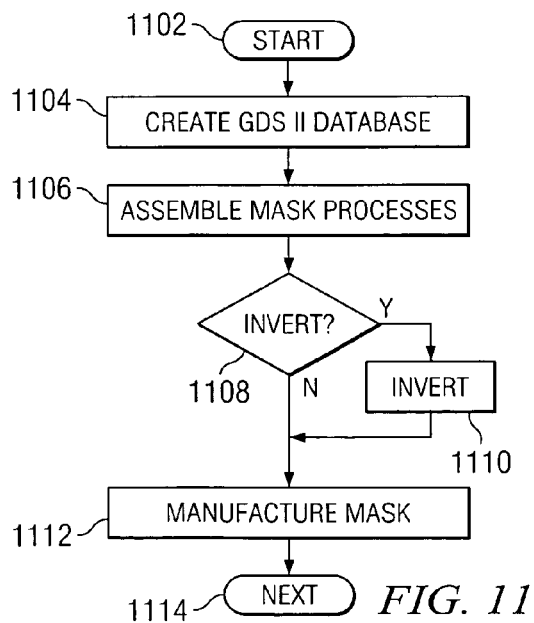
FIG. 11 illustrates a flow chart depicting the operation of manufacturing the mask.

Referring now to FIG. 11, there is illustrated a process flow for forming the mask. This is initiated at a block 1102 and then proceeds to block 1104 to create the GDS II database, i.e., the drawing layers. These are then forwarded to the mask manufacturer, who then assembles various processes for the various drawn layers, as indicated by a function block 1106. The program then flows to a function block 1108 to determine whether the mask data is to be inverted. If yes, then the program flows along a "Y" path to a block 1110 to invert the mask data. However, if the mask data is not to be inverted, the program flows along a "N" path to a function block 1112 to manufacture the mask, which is also the location that the program flows from block 1110. After the mask has been manufactured, the program flows to a function block 1114 to go to the next mask.

Figure 12:
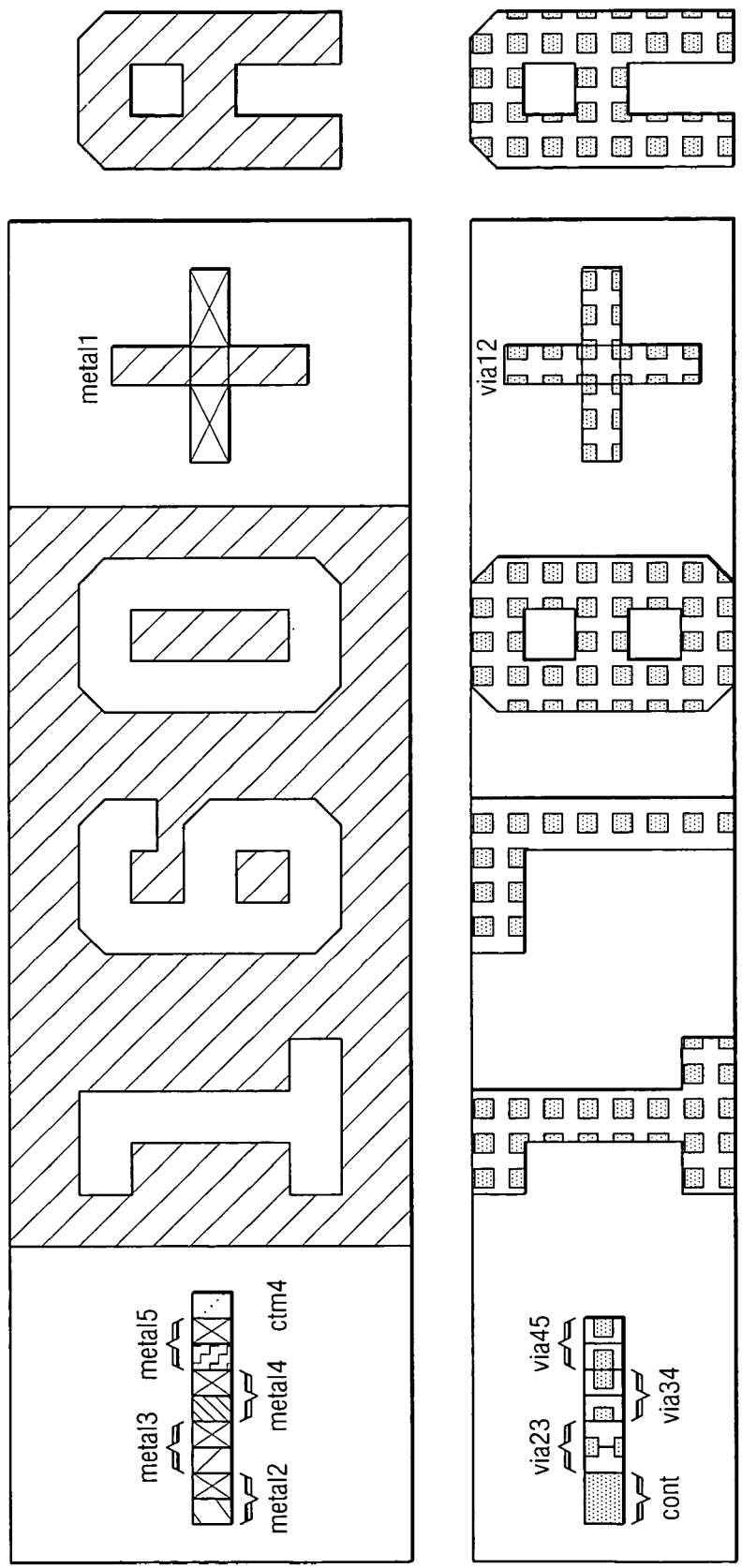
FIG. 12 illustrates an example of the indicator region.

Referring now to FIG. 12, there is illustrated an example of the indicator area on the drawing layers for a clear tone mask and a dark tone mask prior to inversion, and its appearance. In this example, the mask ID for the dark tone mask is "160" and for the clear tone is "178," with the dark tone mask associated with a metal layer process and the clear tone mask associated with a via process. For the dark tone mask, the process associated therewith is "metal1" such that the "+" indicator will be clear on the drawn layer for the Boolean operation of the metal1 drawing layer and NOT any of the other drawing layers. The "−" indicator will be associated with other metal drawing layers that are not to be incorporated and will be dark in the drawn layer. The clear tone mask has the drawn layer formed such that the indicator "170" is dark and the "+" indicator is dark. The "+" indicator represents that this mask is for only the drawn layer for the vial2. Thus, the "+" indicator will be associated with the Boolean operation of the drawn layer for vial2 AND NOT other drawn layers. The "−" indicator is associated with other via drawn layers that are not to be incorporated in this mask, and it should be clear in the combined drawn layer. When the dark tone mask is inverter, then the mask ID ""160" will be dark.

Although the preferred embodiment has been described in detail, it should be understood that various changes, substitutions and alterations can be made therein without departing from the spirit and scope of the invention as defined by the appended claims.

What is claimed is:

1. A method for forming a mask, comprising the steps of:
    creating at least one drawing layer that defines changes to the structures to be formed on the surface of a semiconductor substrate at one step in the processing thereof, which step involves the use of a mask, wherein the at least one drawing layer will define a pattern region that will either result in removal of the material from the semiconductor substrate in the defined pattern region, or removal of matter from the semiconductor substrate around the defined pattern region;
    creating in the at least one drawing layer an indicator area with an indicator region disposed therein that will result in a positive visible pattern being formed on a resulting mask regardless of whether the mask is a dark tone mask or a clear tone mask, the indicator region appearing in the negative on the drawing layer if the resultant mask is a dark tone mask; and
    creating a mask from the at least one drawing layer as either a dark tone mask having a transparent region corresponding to the defined pattern region for exposing the underlying substrate if the defined pattern region is associated with a process that results in material being removed from around the defined pattern region, or as a clear tone mask having an occluding region corresponding to the defined pattern region if the defined pattern region is associated with a process that results in material being removed from the defined pattern region.

2. The method of claim 1, wherein the step of creating at least one drawing layer comprises creating at least a plurality of drawing layers and wherein the step of creating the mask comprises combining the drawing layers and, wherein, the at least one mask has the indicator defined therein.

3. The method of claim 1, wherein the indicator region includes identification for identifying the mask apart from other masks.

* * * * *